United States Patent
Brouns

[19]

[11] Patent Number: 5,773,831
[45] Date of Patent: Jun. 30, 1998

[54] PATCH COUPLED INFRARED PHOTODETECTOR

[75] Inventor: Austin John Brouns, Dallas, Tex.

[73] Assignee: Lockheed Martin Vought Systems Corporation, Grand Prairie, Tex.

[21] Appl. No.: 820,976

[22] Filed: Mar. 19, 1997

[51] Int. Cl.$^6$ ............................ H01L 27/14; H01L 29/15; G01J 5/20

[52] U.S. Cl. ................................. 250/370.08; 250/338.4; 250/370.06; 250/370.14; 257/21; 257/432

[58] Field of Search ............................... 250/370.08, 332, 250/370.06, 338.4, 370.14; 257/21, 184, 436, 432, 448

[56] References Cited

U.S. PATENT DOCUMENTS

| | | |
|---|---|---|
| 4,503,447 | 3/1985 | Iafrate et al. . |
| 4,620,214 | 10/1986 | Margalit et al. . |
| 5,229,614 | 7/1993 | Andersson et al. ................... 250/338.4 |
| 5,248,884 | 9/1993 | Brewitt-Taylor et al. . |
| 5,389,797 | 2/1995 | Bryan et al. ............................... 257/21 |
| 5,539,206 | 7/1996 | Schimert . |
| 5,552,603 | 9/1996 | Stokes ................................... 250/338.4 |

FOREIGN PATENT DOCUMENTS

| | | | |
|---|---|---|---|
| 0044610 | 1/1982 | European Pat. Off. ........ | H01L 27/14 |
| 2051477 | 1/1981 | United Kingdom ............ | H01L 31/08 |
| 2095900 | 10/1982 | United Kingdom ............ | H01L 31/02 |
| 2113467 | 8/1983 | United Kingdom ............ | H01L 27/14 |
| 2207801 | 2/1989 | United Kingdom ............ | H01L 27/14 |

OTHER PUBLICATIONS

"Antenna–Coupled Infrared Detectors," S.E. Schwarz & B.T. Ulrich, J. of Appl. Phys., vol. 48, No. 5, May 1977, pp. 1870–1873.

"Planar Multimode Detector Arrays for Infrared and Millimeter–Wave Applications," D.B. Rutledge & S.E. Schwarz, IEEE Journal of Quantum Electronics, vol. QE 17, No. 3, Mar. 1981, pp. 407–414.

"Molecular Beam Epitaxial Growth of High Quality HgTe and $Hg_{1-x}Cd_xTe$ Onto GaAs (001) Substrates," J.P. Faurie, S. Sivananthan, M. Boukerche & J. Reno, Appl. Phys. Lett., vol. 45, No. 12, Dec. 15, 1984, pp. 1307–1309.

Primary Examiner—Edward J. Glick
Assistant Examiner—Darren M. Jiron
Attorney, Agent, or Firm—Sidley & Austin

[57] ABSTRACT

An infrared detector element includes a metallic patch which is positioned on the surface of an upper contact layer. A multiple quantum well ("MQW") infrared sensitive structure is positioned between the first contact layer and a second contact layer. The conductive contact layers are transparent to infrared radiation. A groundplane which is reflective to infrared radiation is positioned adjacent the second contact layer. A resonant cavity is formed between the metallic patch and the groundplane. The thickness of this cavity is not greater than approximately one eighth of the wavelength of the incident infrared radiation within the cavity. The metallic patch functions to couple the incident infrared radiation into the resonant cavity wherein the E-field is oriented substantially normal to the plane of the MQW structure. A plurality of the detector elements can be used to form a single pixel and an array of the pixels can be used to form a complete infrared radiation imager.

40 Claims, 8 Drawing Sheets

FIELD DISTRIBUTION

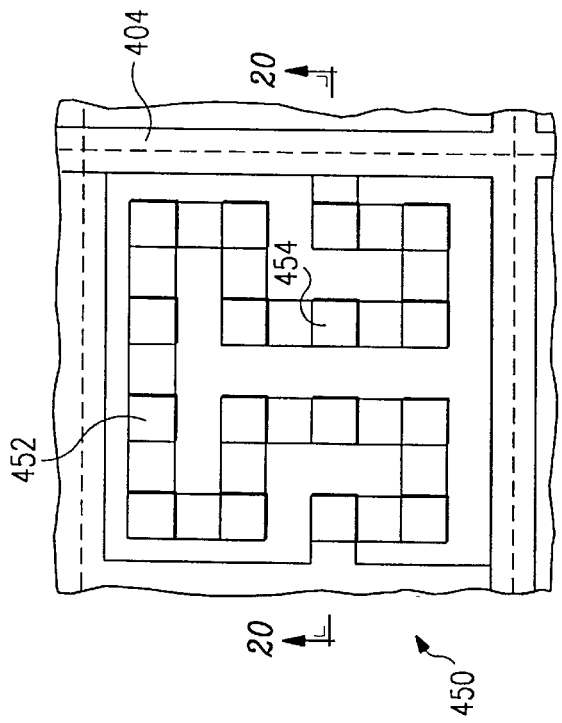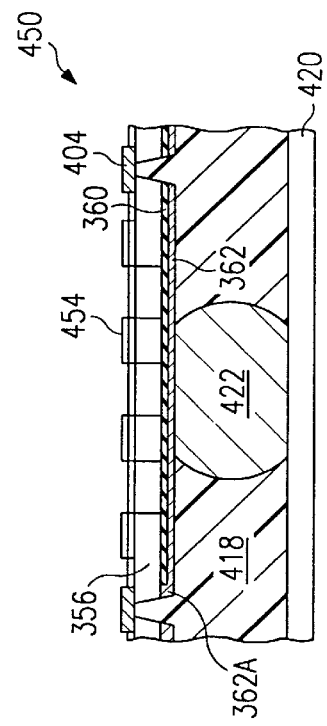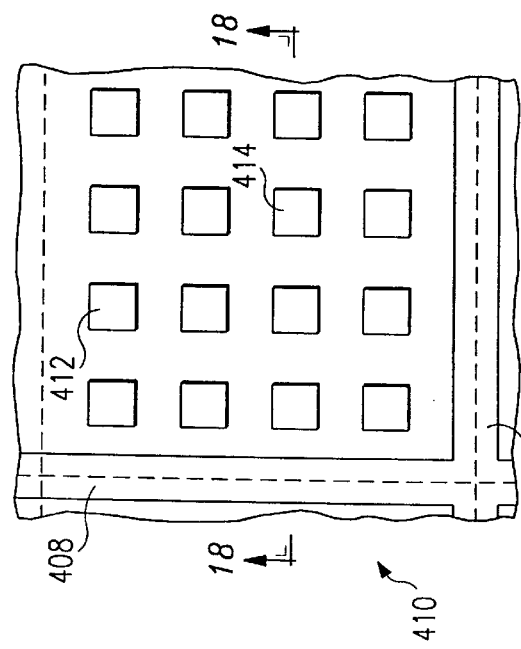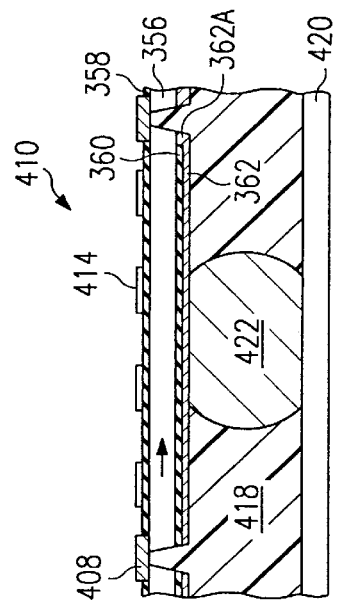
FIG. 17
FIG. 18
FIG. 19
FIG. 20

PATCH COUPLED INFRARED PHOTODETECTOR

TECHNICAL FIELD OF THE INVENTION

The present application pertains in general to devices for detecting infrared radiation and in particular to such devices which are fabricated as integrated structures.

BACKGROUND OF THE INVENTION

Detectors for infrared radiation have many applications. Infrared radiation can often be used to detect objects where visible light is either blocked or not present. Thus, it is possible to use infrared detection at night or through clouds, dust or haze. An infrared detector can be in the form of either a single detecting element or an array of such elements to produce an image. A detector which produces such an image is termed a focal plane array.

Infrared radiation can be detected through various ways. One such way is by the use of a material which generates electric charge carriers in response to incident infrared radiation. Examples of such photosensitive materials are mercury cadmium telluride and a multi-layered structure termed a multiple quantum well ("MQW") structure which has alternating layers of wells and barriers. A detector of this type is shown in U.S. Pat. No. 5,539,206 entitled "Enhanced Quantum Well Infrared Photodetector". As described in this patent, the performance of an infrared detector can be improved by reducing the amount of quantum well material present within the detector. One characteristic of a common type of MQW structure is that the detection of infrared radiation occurs only when the E-field vector of the infrared radiation is normal to the plane of the MQW material. One method for achieving this E-field orientation is to have a diffraction grating on the back side of the detector. As shown in the noted patent, the MQW material itself can be formed in the shape of a diffraction grating. The grating diffracts the incident normal infrared radiation to produce E-field components which are normal to the MQW layer. This, however, requires the use of a relatively thick layer of MQW material. Therefore, there exists a need for an infrared detector structure which can alter the E-field vector, but can detect infrared radiation with a substantially thinner layer of MQW material.

A further design for an infrared detector which has a thin film of photoresponsive material is U.S. Pat. No. 5,248,884.

SUMMARY OF THE INVENTION

A selected embodiment of the present invention is an infrared radiation detector which includes a planar, infrared radiation sensitive structure which produces carriers in response to infrared radiation. The infrared radiation sensitive structure has opposing first and second surfaces. A first electrically conductive layer is positioned proximate the first surface of the infrared sensitive structure and is electrically connected to it. The first electrically conductive layer is transparent to the infrared radiation. A planar patch, which is conductive to the infrared radiation, is positioned on the surface of the first conductive layer opposite from the infrared sensitive structure. An electrically conductive, planar infrared radiation reflective groundplane is positioned proximate the second surface of the infrared sensitive structure and is electrically connected thereto. A resonant cavity is formed between the patch and the groundplane. The patch has a width which is equal to approximately one half of the wavelength of the infrared radiation within the materials in the cavity. The resonant cavity has a thickness which is not greater than approximately one eighth of the wavelength of the infrared radiation within the infrared sensitive structure. The planar patches can have multiple configurations including round, square, rectangular and elongate.

In a further aspect, the infrared sensitive structure is patterned to remove most of the material that has not beneath the patch.

The preferred infrared sensitive material for the present invention is a multiple quantum well (MQW) structure.

A plurality of the patches can be connected together to form a pixel element for a radiation detector and a group of the pixel elements can be fabricated together to form an imager.

A still further configuration has insulating layers on each side of the infrared sensitive structure with conductors on opposite surfaces at opposite edges to provide lateral current flow parallel to the plane of the infrared sensitive structure.

BRIEF DESCRIPTION OF THE DRAWINGS

For a more complete understanding of the present invention and the advantages thereof, reference is now made to the following description taken in conjunction with the accompanying drawings, which are not necessarily to scale, in which:

FIG. 17 is an illustration of a patch layout for one of the pixels illustrated in FIG. 16, FIG. 18 is a section view taken along lines 18—18 shown in FIG. 17, FIG. 19 is a plan view of a further embodiment of the present invention wherein the patch detector elements are connected in series between a common bus and a contact to an ROIC, FIG. 20 is a section view taken along lines 20—20 of the infrared detector shown in FIG. 19.

DETAILED DESCRIPTION

Figure 1:
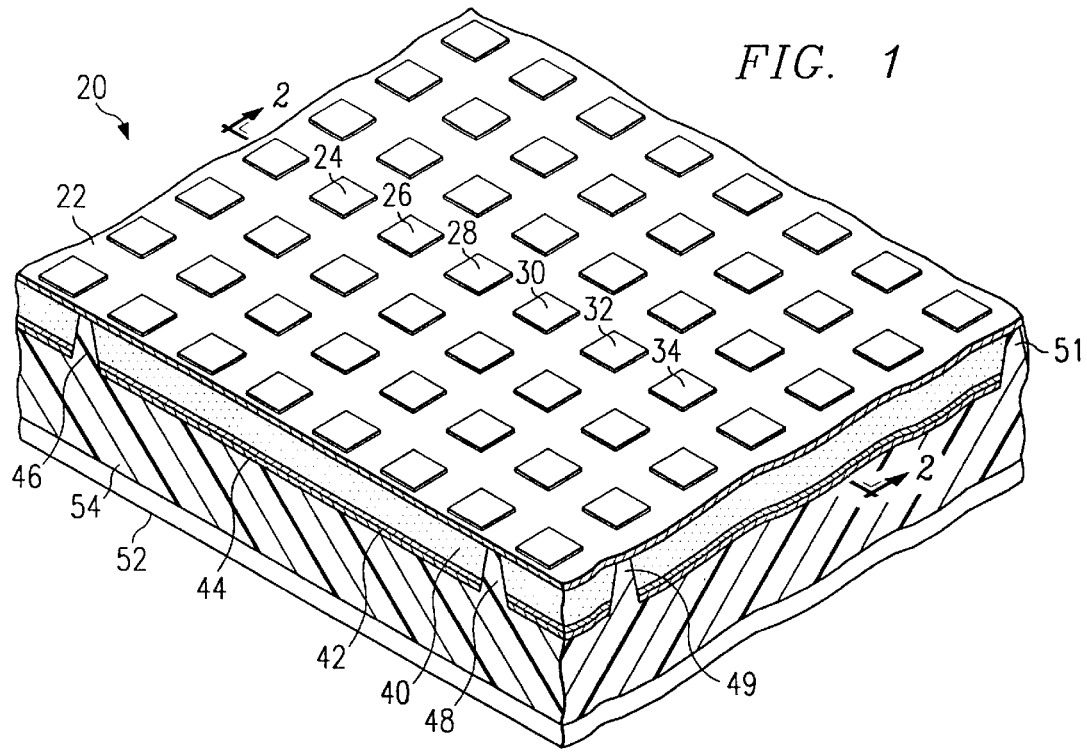
FIG. 1 is a perspective illustration for an array of patch coupled infrared detector elements forming a pixel of an infrared detector.

Referring now to FIG. 1, there is shown an infrared detector 20 in accordance with the present invention. The detector 20 includes a single pixel within an overall imager comprising an array of such pixels. The detector 20 has an upper conductor contact layer 22 comprising n+GaAs material having a thickness of approximately 0.15 microns. The layer 22 is transparent to infrared radiation. The detector 20 has an array of patches on the surface thereof. These patches have a square configuration, are deposited on the surface of the layer 22 and have a thickness of approximately 600 angstroms. This is two to three times greater than the skin depth for infrared radiation. A representative row of these patches have reference numerals 24, 26, 28, 30, 32 and 34. The patches are preferably made of gold. It is typical to deposit a layer of titanium before the gold to improve adhesion.

Figure 4:
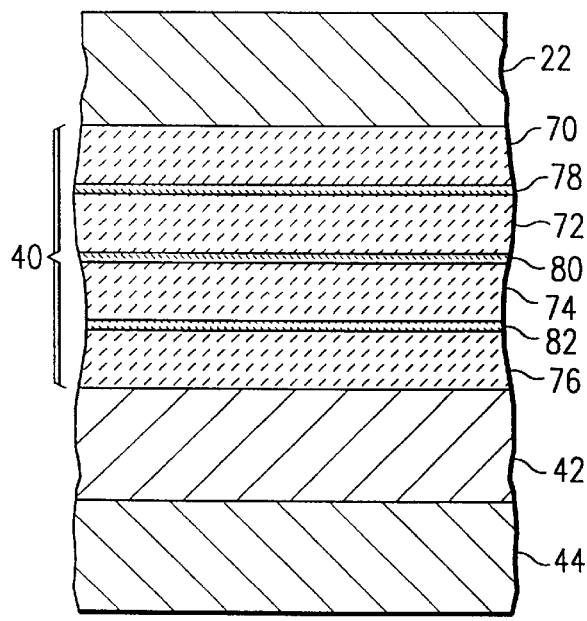
FIG. 4 is a section view of an MQW infrared sensitive structure for use in the present invention.

The conductive layer 22 is fabricated on the surface of an infrared sensitive structure 40, which is preferably a multi-quantum well photodetector, as further illustrated in FIG. 4. Immediately below the structure 40, there is provided a second conductive contact layer 42 which has a thickness of approximately 0.15 microns and comprises n+GaAs. The second conductive layer 42 is also transparent to the incident infrared radiation.

Immediately below the second conducting layer 42 is an infrared reflective layer groundplane 44 which preferably is made of gold and has a thickness of approximately 2000 angstroms. Typically in each pixel, a portion of the gold groundplane is alloyed with germanium to create a low resistance ohmic contact between the groundplane 44 and layer 42.

Figure 2:
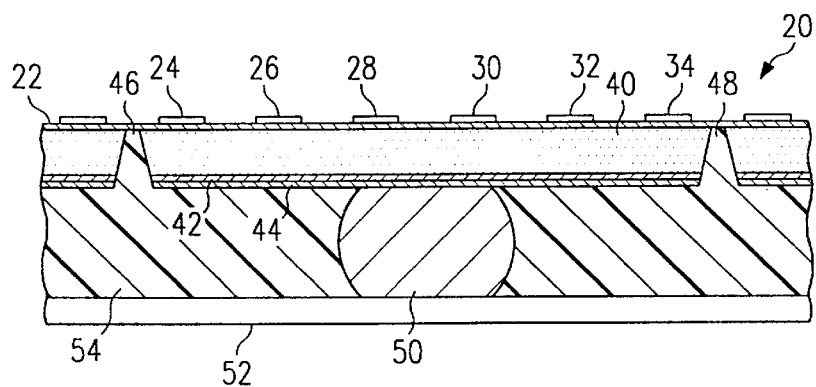
FIG. 2 is a section view along lines 2—2 of the infrared detector shown in FIG. 1.

Referring to both FIGS. 1 and 2, the individual pixel shown in FIG. 1 for the detector 20 has isolation trenches 46, 48, 49 and 51 which extend through the elements 40, 42 and 44 and electrically isolate these elements from similar adjacent elements on the other sides of the trenches. Trenches 49 and 51 are perpendicular to and intersect the trenches 46 and 48 to isolate the 36 patches shown for one pixel in FIG. 1. Since the trenches do not extend through the first conductive layer 22, the first conductive layer is continuous and common to all pixels. Therefore, an electrical contact for a common detector bias current and the signal return is needed only at the periphery of the detector array.

Referring to FIG. 2, below the group of 36 patches shown in FIG. 1 for one pixel, there is provided an indium bump 50 which contacts the groundplane 44 at its top side and contacts a read out integrated circuit (ROIC) 52 at its lower side. The space surrounding the indium bump 50 and extending into the trenches 46, 48, 49 and 51 is filled with a non-conductive epoxy 54. The epoxy 54 serves to bind together the ROIC 52 with the adjacent detector structure that includes the patches 24–34 and the groundplane 44.

The ROIC 52 supplies a fixed bias voltage of, for example, −0.25 vdc between the second conductive layer 42 in each pixel and the common first conductive layer 22. The ROIC, separately for each pixel, also detects the signal photocurrent generated by the detection of incident infrared radiation. A representative direct injection ROIC structure for use with the present invention is described in "The Infrared & Electro-Optical Systems Handbook," Volume 3, Electro-Optical Components, William D. Rogatto, Editor, Chapter 5, "Readout Electronics for Infrared Sensors," John L. Vampole, ERIM/SPIE, 1993 (see section 5.6.6).

Referring to FIG. 2, there is formed between each of the patches and the groundplane 44 a respective, corresponding resonant cavity. Thus, for the detector 20 shown in FIG. 1, there are formed 36 such resonant cavities for one pixel. In the resonant cavities, for the embodiment of the infrared sensitive layer 40 and the electrically conductive layers 22 and 42 described herein, the index of refraction is approximately 3.2. The preferred thickness for the resonant cavity is approximately one eighth of the wavelength of the desired incident infrared radiation within the resonant cavity. For example, if the free space wavelength of infrared radiation of interest is 10 microns, the corresponding wavelength in a medium with an index of refraction of 3.2 is 3.1 microns. One eighth of this wavelength is a dimension which is approximately 0.39 microns. Thus, the preferred thickness of the resonant cavity for each of the patches, such as 24–34, is 0.39 microns. However, it can also be a lesser thickness. Thus, the preferred thickness for the applicable cavity is equal to or less than approximately one eighth of the wavelength of the incident infrared radiation within the resonant cavity.

The wavelength W–L in the cavity is equal to the wavelength in air divided by an "effective" refractive index: $N_{EFFECTIVE} = \sqrt{[(N_{MQW})^2 VOL_{MQW} + (N_{COND})^2 VOL_{COND}]/VOL_{TOTAL}}$. That is, it is a weighted value that depends on the relative volumes VOL and individual refractive indices N of the materials in the cavity, ie., the MQW material and the electrically conductive material COND. In practice, the conductive layers have almost the same index as the sensitive layer. Incidentally, $N^2$ is equal to the dielectric constant in relatively good dielectric materials.

Figure 3:
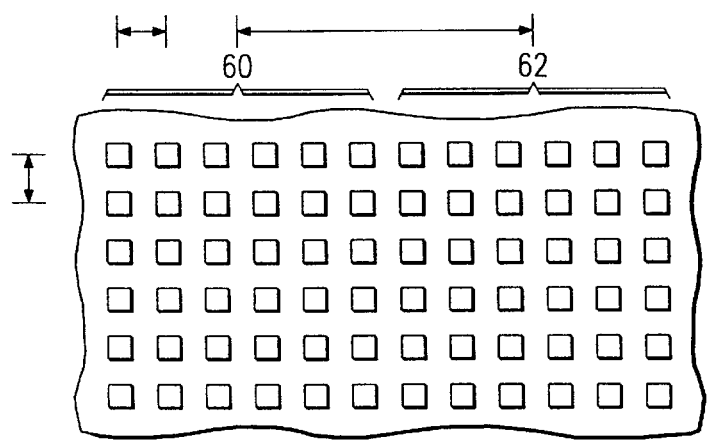
FIG. 3 is a plan view of two adjacent pixels having patch coupled detector elements for illustrating the spacing between the patches and the pixels.

Referring now to FIG. 3, there is shown a plan view of two pixels for an infrared detector, such as shown in FIGS. 1 and 2. This detector has pixels 60 and 62, each of which has 36 patches, as shown in FIG. 1. The center to center spacing between the pixels 60 and 62 is preferably about 20 microns, but could be made larger by the use of more patches in each pixel. Each patch has a width which is approximately one half of the wavelength for the incident infrared radiation. This is determined for the wavelength within the resonant cavity. As noted above, the index of refraction within this region for the selected embodiment is approximately 3.2. Thus, for receiving 10 micron wavelength infrared radiation, the preferred width for each of the patches is approximately 1.6 microns. The center-to-center spacing between the patches in the array is approximately 3.3 microns for the preferred embodiment. This spacing may be selected based on empirical data or computer-aided simulations of patch coupled infrared detectors. At resonance, each cavity in effect receives and absorbs the infrared radiation that falls within an area that is larger than the patch itself. This area is called the effective aperture for the patch coupled detector element. The patches in a detector should be spaced close enough together so that the effective apertures at least partially overlap, allowing the infrared absorptance to approach 100%. However, closer spacings might be used, for example, to broaden the spectral bandwidth of the infrared absorptance.

The MQW structure for a preferred embodiment of the present invention is shown in FIG. 4. The infrared sensitive structure 40 is positioned between highly doped GaAs conductive contact layers 22 and 42. The structure 40 shown in FIG. 4 comprises alternating layers of gallium arsenide (GaAs) which layers are defined to be "wells". These are alternated with layers of aluminum gallium arsenide (AlGaAs) which are defined to be "barriers". The barriers are much thicker than the wells. As shown in FIG. 4 there are four barrier layers 70, 72, 74 and 76. Alternated between the barrier layers are wells 78, 80 and 82. Each barrier layer has a preferred thickness of approximately 450 angstroms and each well has a preferred thickness of approximately 50 angstroms. The MQW material of the structure 40 can be tuned to a particular wavelength of infrared radiation for maximum photoconductive response by varying the Al to Ga ratio during the barrier growth. This can be tuned from very long wave IR (VLWIR) to midwave IR (MWIR). The selected size and thereby resonance frequency of the patch is preferably designed to coincide with the maximum response wavelength of the MQW material. There may be other numbers of wells and barriers in an MQW structure for use in the present invention.

Figure 5:
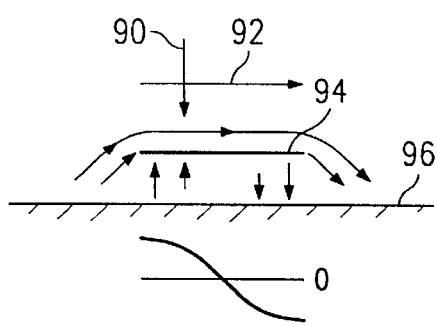
FIG. 5 is a schematic illustration of the radiation E-field distribution in the vicinity of a single patch.

An important aspect of the present invention is illustrated in FIG. 5. The preferred infrared sensitive material for the present invention is an MQW structure, such as shown in FIG. 4. The direction of propagation for the incident infrared radiation is illustrated by an arrow 90. The E-field produced by that incident infrared radiation has the orientation shown by arrow 92. Thus, the E-field is perpendicular to the direction of propagation of the infrared radiation. The MQW material as described absorbs infrared radiation only when an E-field vector component is normal to the plane of the MQW structure. Thus, when the angle of incidence of the infrared radiation is normal to the plane of the MQW structure, there is little or no absorption of the infrared radiation by the MQW structure. Heretofore, infrared detectors have addressed this problem by use of a diffraction grating to deflect the incident infrared radiation to create at least a component of the E-field which is normal to the plane of the MQW layer.

Further referring to FIG. 5, there is shown a patch 94 above a groundplane 96. The patch 94 corresponds to any one of the patches shown in FIGS. 1 and 2 and the groundplane 96 corresponds to the groundplane 44 shown in FIGS. 1 and 2. The effect of the metallic patch of the present invention is to alter the shape of the E-field so that this field is substantially perpendicular to the patch in the cavity region between the patch 94 and the groundplane 96. The arrows around the patch 94 illustrate the altered E-field. Note that immediately above the patch 94, the E-field has substantially the same orientation as that shown by arrow 92. However, at the edges and below the patch 94, the E-field angle is angularly shifted so that it becomes substantially normal to the patch 94 within the cavity region, which is between the patch and groundplane. With the E-field vector thus shifted, the MQW material within the cavity region between the patch 94 and groundplane 96 absorbs the incident infrared radiation. The amplitude and relative sign of the E-field laterally across the cavity region is illustrated by the field distribution curve shown in FIG. 5 immediately below the groundplane 96.

Further referring to FIG. 5, the fields in the cavity are in the form of electromagnetic waves that propagate in the space between the patch and the groundplane. When the patch and groundplane are closely spaced, eg., less than one-eighth wavelength in the cavity material, the fields have a well defined distribution in which the E-field is predominantly perpendicular to the groundplane, the patch, and the layers of sensitive MQW material in between. This field distribution is called a 'mode', or more loosely, a 'standing wave pattern'. The standing wave is the resultant of waves that propagate in opposite directions and are repeatedly reflected at the edges of the cavity. In the simplest or dominant mode, the electric field strength is greatest near the edges of the patch and has a minimum half way between. At resonance, the period of the incident IR radiation equals the round trip travel time of the waves in the cavity. This is the so-called half-wave resonance condition. The direction of propagation of incident radiation is shown in FIG. 5 to be normal to the detector surface. When a lens of low F number is used to collect and focus infrared radiation on the detector, some of the radiation will arrive at the detector at oblique angles that are well away from normal, for example as much as 30 degrees or more. The presence of oblique radiation will generally reduce the infrared absorptance of the detector somewhat but will not alter the field distribution in the cavity or the resonance wavelength. Although there is some re-radiation at the ends of the patch, the amount is small at resonance. As a result, the trapped fields are intense and the infrared absorption of incident radiation can easily approach 100%. This has been demonstrated by computer simulations. Since a square patch has equal sides, the resonance wavelength and percent absorption is independent of the polarization of the incident IR radiation. It has also been demonstrated that a round patch is just as effective as a square patch for absorbing polarized or unpolarized radiation. Round patches are generally preferred since they are easier to fabricate accurately. A square patch and a round patch will resonate at nearly the same wavelength if they are equal in area. It is also evident that a rectangular patch will exhibit a longer resonance wavelength when the incident IR polarization vector in FIG. 5, shown by arrow 92, is parallel to the long dimension of the patch than when it is not.

Infrared energy in the cavity is absorbed in the sensitive detector material, but there can also be significant absorption in the patch and groundplane metals. Ohmic loss in the metals detracts from the detector performance, so high conductivity metals such as gold or aluminum should be used. Since metals become increasingly better conductors at the longer infrared wavelengths, patch coupled infrared detectors are particularly attractive for very long wavelength infrared (VLWIR, 12–20 microns). It is important that the patch-to-groundplane spacing be small, eg., one-eighth wavelength or less. If the spacing is larger, the field concentration is diminished and the infrared absorption is reduced. As the spacing approaches one quarter wavelength, the cavity mode described previously can no longer be efficiently supported and a competing mode appears in which the E-field is parallel to, and tends to be concentrated near, the patch.

There is no specific lower limit on the patch-to-groundplane spacing; eventually a point of diminishing returns is reached where the beneficial effect of reducing the volume of sensitive material is offset by the increased proportion of loss in the patch and groundplane metals.

Antenna coupling is a well known means of intercepting and concentrating infrared radiation. In one example (U.S. Pat. No. 5,248,884, "Infrared Detector"), antenna-like structures are employed without a groundplane to create fringing fields in sensitive detector material. In this type of detector, the electric field lines are curved, relatively unbounded, and without a single predominant polarization relative to the detector plane. This would be true even with the conventional use of a groundplane located a quarter-wavelength behind the antenna array. The patch coupled infrared detector differs in that the patch to groundplane spacing is much less than a quarter wavelength, forcing the incident infrared energy into a well defined resonance mode in which the electric field is predominantly perpendicular to the patch and groundplane.

The advantage of patch coupling is that it maintains high infrared absorptance while allowing a significant reduction in the volume of sensitive detector material, and reorients the incident electric field to the polarization required by commonly used quantum well detector materials.

Figure 6:
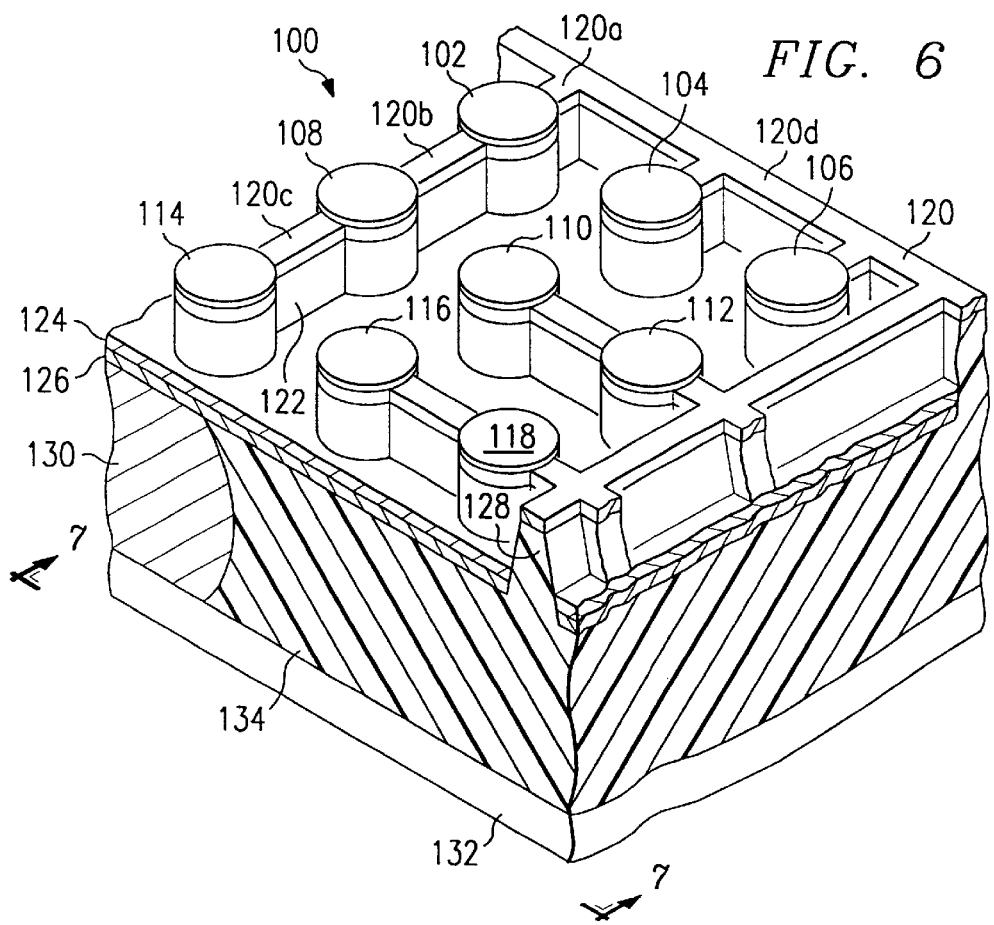
FIG. 6 is a perspective illustration of a portion of a pixel having a plurality of patches with an underlying patterned conductive layer and infrared sensitive structure which includes structure for coupling the detector elements together.
Figure 7:
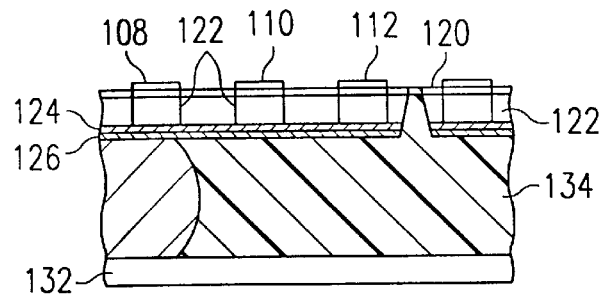
FIG. 7 is a section view of the infrared detector illustrated in FIG. 6.

Referring now to FIGS. 6 and 7, there is shown a further embodiment of the present invention. An infrared detector 100 is shown in these Figures, but only one fourth (one quadrant) of a pixel is illustrated. The lower right quadrant of the pixel is illustrated. The overall pixel, as shown in FIG. 1, has 36 patches and the quadrant shown in FIG. 6 has 9 patches. These are patches 102, 104, 106, 108, 110, 112, 114, 116 and 118. These patches have a preferred round configuration while the spacing is approximately the same as described for the patches shown in FIGS. 1 and 2.

The patches 102–118 are positioned on a first conductive contact layer 120 which has been patterned as shown. The layer 120 corresponds to the layer 22 shown in FIGS. 1 and 2. The layer 120 is patterned to have the configuration of the patches 102–118 together with connecting bridge elements such as 120a, 120b and 120c. These are joined to a interconnecting bus element 120d. Thus, all of the patches within one pixel for the detector 100 are electrically interconnected by the patterned elements of the layer 120. Each of the patches has a branching element of the contact layer 120 connected to it.

Below the layer 120 there is a planar layer of infrared sensitive material 122 which corresponds to the structure 40 shown in FIGS. 1 and 2. The layer 122 is patterned to have substantially the same configuration as the conductive layer 120.

The infrared sensitive material 122 is positioned on the surface of a planar conducting contact layer 124 which corresponds to the conducting contact layer 42 shown in FIGS. 1 and 2. The layer 124 is itself positioned on a groundplane 126 which corresponds to the groundplane 44 shown in FIGS. 1 and 2. The pixel for the infrared detector 100 shown in FIG. 6 is isolated from an adjoining pixel by an isolation trench 128 which is shown extending through multiple elements of the combined structure of the conductive layer 124 and the infrared sensitive layer 122. Similar trenches extend along the remaining sides of the pixel element to electrically isolate that pixel from adjoining pixels.

As with the detector 20 shown in FIGS. 1 and 2, the detector 100 includes an indium bump 130 which provides an electrical contact between the groundplane 126 and a read out integrated circuit 132. The region between the ROIC 132 and the groundplane 126 is filled with an epoxy 134.

The detector 100 shown in FIGS. 6 and 7 functions essentially the same as that described for the detector 20 in FIGS. 1 and 2, but with enhanced performance because of the reduced volume of infrared sensitive material. To further reduce the volume of infrared sensitive material, the patches should be spaced as far apart as possible, consistent with maintaining high infrared absorptance.

Figure 8:
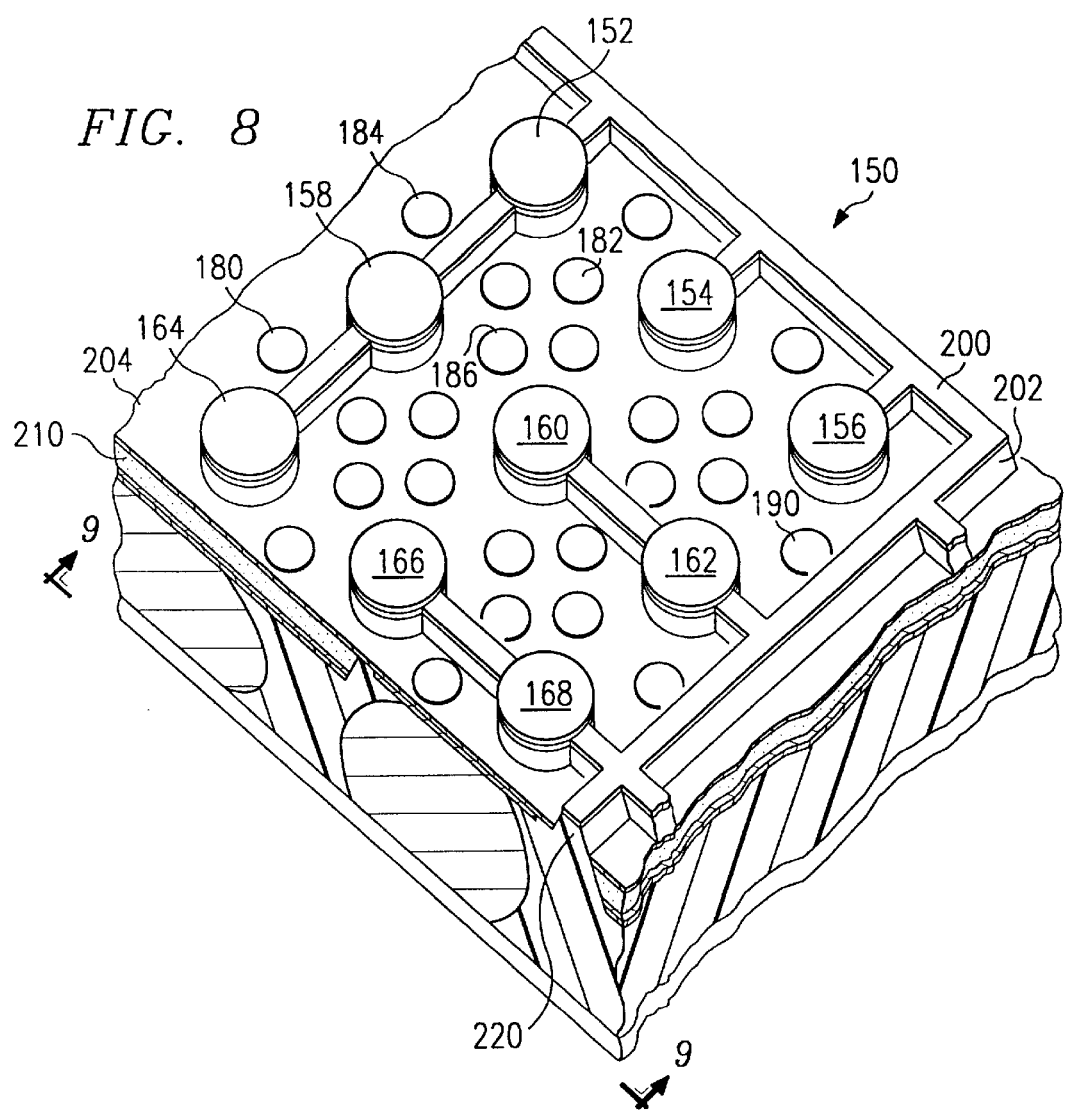
FIG. 8 is a plan view of a dual band infrared detector in accordance with the present invention wherein there are two different sizes of patches corresponding to two different infrared bands.
Figure 9:
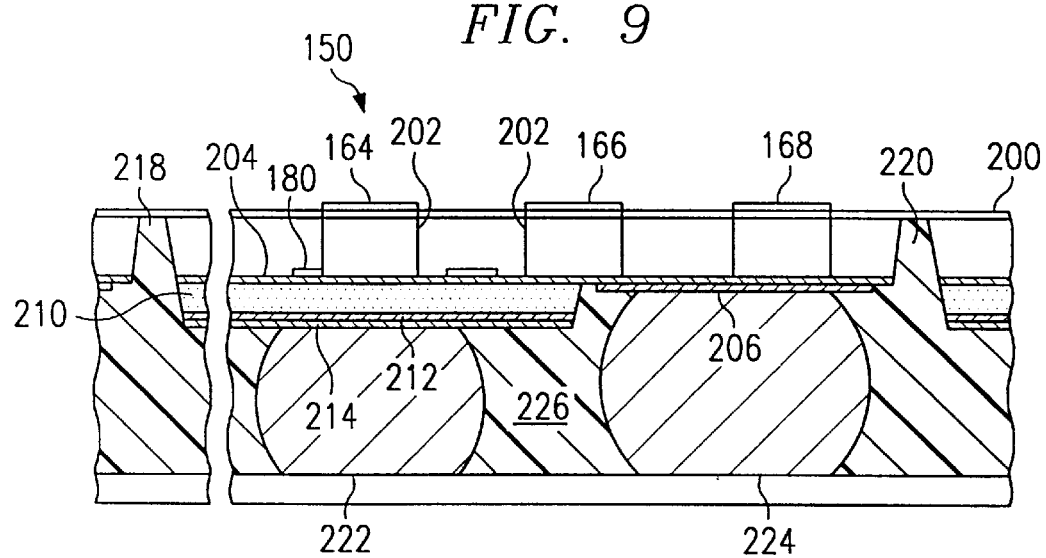
FIG. 9 is a sectional view of the dual band detector shown in FIG. 8.
Figure 10:
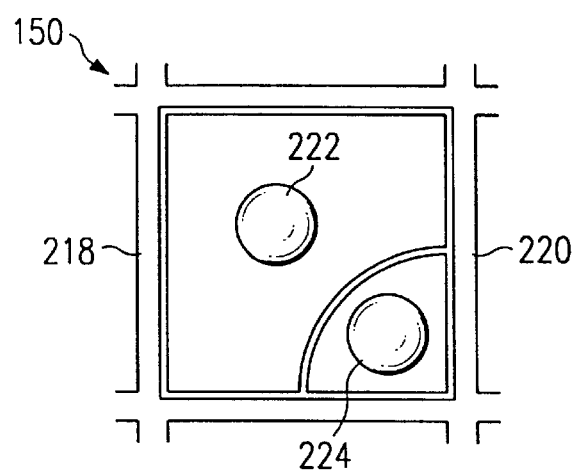
FIG. 10 is a bottom view of the dual band detector illustrated in FIG. 8.

A still further embodiment of the present invention is illustrated in FIGS. 8, 9 and 10. This is a dual band infrared radiation detector 150 which is designed to receive two different bands of infrared radiation. The detector 150 is designed to receive long wave infrared radiation (LWIR) as well as very long wave infrared radiation (VLWIR). The LWIR band is typically 8–12 microns and the VLWIR band is typically 12–20. The detector 150 has two sets of patches. The first set consists of the larger patches which are identified by reference numbers 152, 154, 156, 158, 160, 162, 164, 166 and 168. This set of patches and the related underlying structures are substantially the same as that shown in FIGS. 6 and 7 for the patches 102–118. The detector 150 has a second set of patches for receiving the long wave infrared radiation. These are distributed around and between the larger patches 152–168. Representative ones of the patches in the second group for receiving the second band are shown by reference numerals 180, 182, 184, 186 and 190.

The first set of patches for receiving the VLWIR, that is patches 152–168, are electrically interconnected by a first conductive contact layer 200, which corresponds to the layer 120 shown in FIG. 6. The layer 200 is positioned immediately above a patterned layer of VLWIR sensitive material 202. The material 202 corresponds to the infrared sensitive material 122 shown in FIGS. 6 and 7.

The second set of patches, which include patches 180–190, are positioned on the surface of a second infrared transparent conductive contact layer 204. This corresponds to layer 124 shown in FIG. 6.

Access to the second contact layer 204 of conductive material is provided by a gold-germanium alloy pad 206 which makes a low-resistance ohmic contact to layer 204 and on which indium bump 224 is deposited. The detector 150 further includes an unpatterned second layer of LWIR sensitive material 210 beneath the second conductive contact layer 204. The material 210 is substantially the same as the structure 40 shown in FIGS. 1 and 2. The material 210 underlies each of the LWIR patches such as 184, 186 and 190. A third conductive contact layer 212 is immediately below the planar material 210. A groundplane 214 is immediately below the conductive layer 212. The thickness and composition of contact layer 212 is substantially the same as that of contact layer 124 shown in FIG. 6. The groundplane 214 in FIGS. 8 and 9 serves as a common groundplane for both the VLWIR and LWIR patch coupled infrared detectors. The upper part of the VLWIR resonant patch cavity is patterned and contains VLWIR-responsive MQW material 202 whereas the bottom part of the VLWIR resonant patch cavity contains unpatterned LWIR-responsive MQW material 210 which does not respond to VLWIR. The overall thickness of the VLWIR cavity must obey the rule of being not more than about one-eighth the VLWIR wavelength in the materials that fill the cavity. Likewise the overall thickness of the LWIR cavities must obey the same rule for LWIR wavelengths.

The portion of the pixel shown for the detector 150 in FIGS. 8 and 9 is isolated from the adjoining pixels by isolating trenches which include trenches 218 and 220. An indium bump 222 is positioned below the groundplane 214 and is in electrical contact therewith. An indium bump 224 is positioned beneath the gold-germanium alloy pad 206 and is in electrical contact with it as well. The indium bumps 222 and 224, as with the previous indium bumps, are connected to a read out integrated circuit. The region around the bumps 222 and 224 is filled with an epoxy 226.

A bottom view of the detector 150 is shown in FIG. 10. This view is illustrated with the epoxy 226 not shown. The bump 224 in conjunction with common conductive layer 200 provides an electrical bias and conducts the detection signal from the structures associated with the very long wave infrared radiation cavities associated with the large patches including 158, 160 and 162. The indium bump 222 in conjunction with bump 224 provides a bias and conducts the detection signal from the long wave sensors associated with the smaller patches including 184, 186 and 190. Thus, for each pixel of the detector 150, there are provided two conductive bumps and a common conductive contact layer 200 for concurrently providing bias signals and conveying the detection signals produced by the sensors for each of the two bands of infrared radiation. A dual band ROIC designed to perform this function is described in U.S. Pat. No. 5,523,570 entitled "Double Direct Injection Dual Band Sensor Readout Input Circuit", which is incorporated herein by reference.

Figure 11:
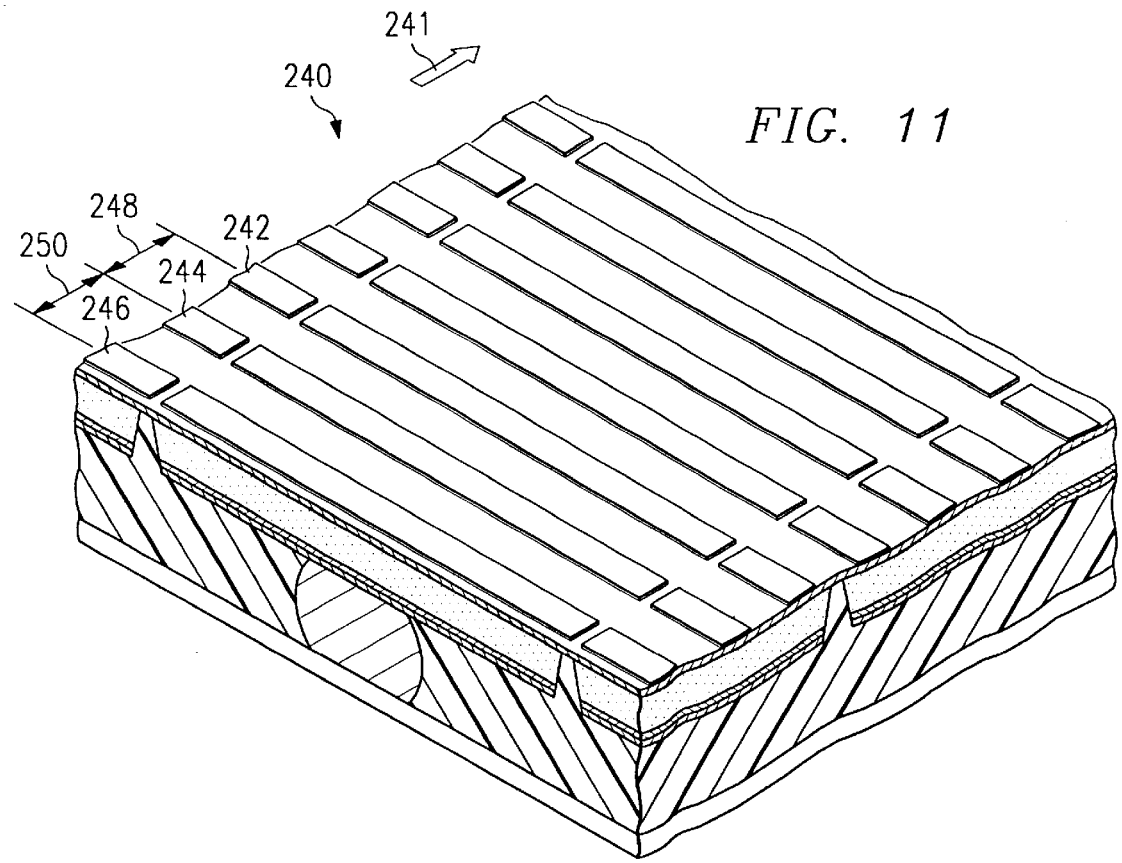
FIG. 11 is a perspective illustration of a further embodiment of the present invention having elongate patches.

A still further embodiment of the present invention is illustrated in FIG. 11. A detector 240 has a configuration substantially the same as that shown in FIG. 1 for the detector 20, but with the square patches, such as patches 24–34, replaced by elongate metallic strips 242, 244 and 246. The width of these strips is selected to be the same as the width for the patches shown in FIGS. 1 and 2 with respect to the incident infrared radiation. The center-to-center spacing between the strips 242, 244 and 246 is illustrated by the arrows 248 and 250. This spacing is the same as the center-to-center spacing of the patches described in reference to FIG. 3. The remainder of the structure for the detector 240 shown in FIG. 11 is substantially the same as that shown for the detector 20 in FIG. 1. The detector 240 is sensitive to the polarization indicated by the arrow 241 whereas the detectors shown in FIGS. 1, 6 and 8 are not polarization sensitive. The strips 242, 244 and 246 extend within one pixel element and are electrically separated from similar strips for adjacent pixel elements. The spacing between strips is constant within the pixel but may be increased at the boundary between pixels. The gaps within the strips are about the same width as, and are positioned directly above, the trenches in the MQW structure, as shown in FIG. 1. The gaps may be eliminated if it is found that doing so does not promote the conduction of infrared crosstalk between adjacent pixels. To enhance performance in an alternate embodiment, the volume of infrared sensitive material may be reduced by patterning each pixel to remove the first conductive contact layer and the MQW structure in the regions between the strips.

Figure 12:
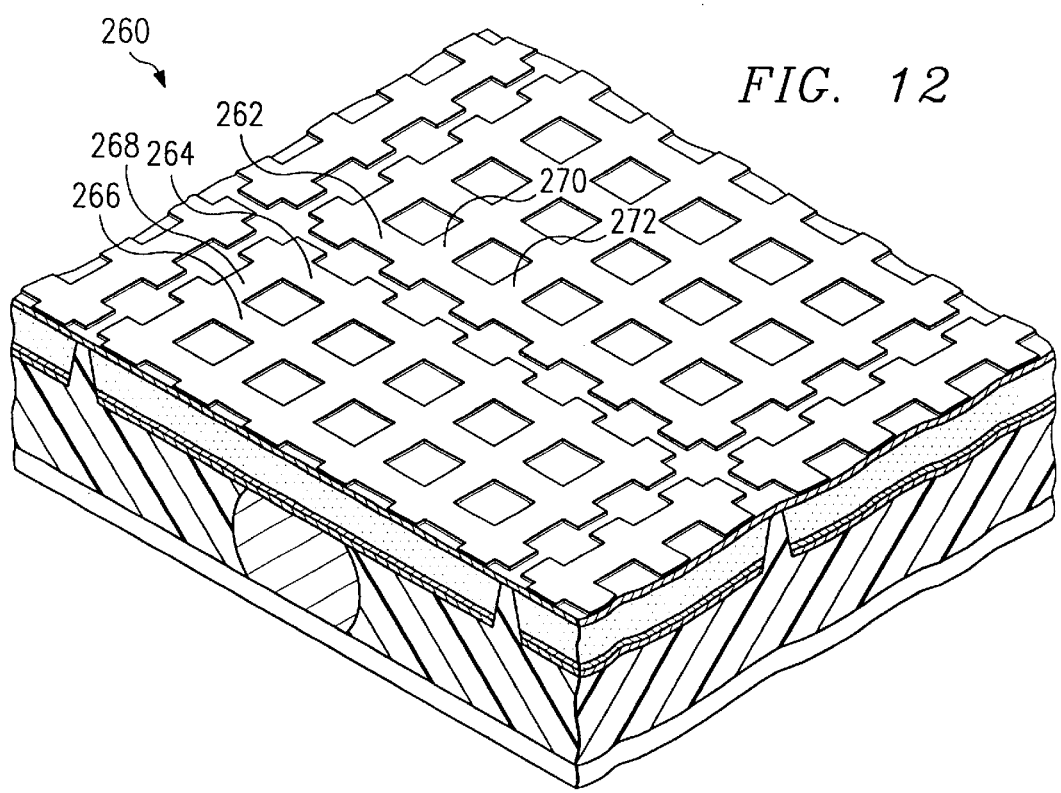
FIG. 12 is a still further embodiment of the present invention having an orthogonal grid of elongate patches.

FIG. 12 is a still further embodiment of the present invention. A detector 260 is substantially similar to the detector 20 illustrated in FIG. 1, but with the array of square patches replaced by a rectangular grid of orthogonal elongate microstrips. These include, for example, horizontal strips 262, 264 and 266 and vertical strips 268, 270 and 272. These strips are electrically interconnected within a single pixel element but are not electrically connected to strips in adjoining pixel elements. The remainder of the structure of the detector 260 is the same as that shown for the detector 20 in FIG. 1. The detector 260 is polarization independent since it receives orthogonal polarization components.

The configuration illustrated in FIG. 5 for coupling infrared energy into a resonant cavity structure, when effected by the strips in FIGS. 11 and 12, results in trapped electromagnetic waves that propagate in a direction transverse to the long dimension of the strips. The strip intersections in FIG. 12 provide an additional coupling means causing incident infrared fields to be coupled into electromagnetic waves propagating lengthwise under the strips. These are counter-propagating waves that, by proper selection of the strip spacing relative to the incident infrared wavelength, may add constructively, creating an additional resonant condition that further enhances the absorption of infrared energy. For example, this can be achieved by spacing the strips approximately one wavelength apart, where the wavelength is that for longitudinal propagation of infrared waves under the strips. To further enhance performance, the volume of infrared sensitive material may be reduced by patterning each pixel to remove the first conductive contact layer and MQW structure in the open spaces between the intersecting strips.

Figure 13:
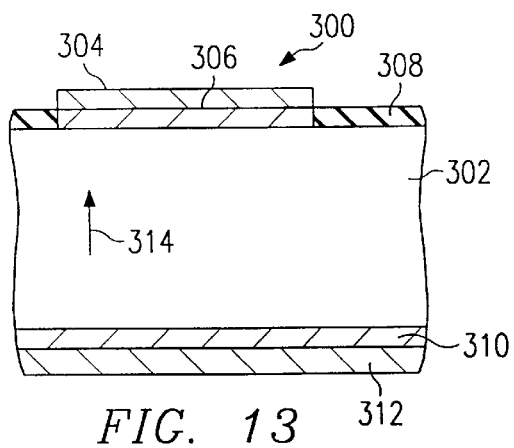
FIG. 13 is a section view of a photoconductive structure in accordance with the present invention wherein the sensitive detector material is HgCdTe.

A further embodiment of the present invention is an infrared detector 300 as shown in FIG. 13. In this detector the infrared sensitive detector material is $Hg_{1-x}Cd_xTe$. This is shown as material 302.

The spectral response of HgCdTe can be adjusted by changing its constituents, the same as is done for MQW material. This is done by changing the value of x in the formula $Hg_{1-x}Cd_xTe$. For an LWIR detector, a value x=0.22 may be used. The index of refraction is then about N=3.56.

The detector 300 has a gold patch 304 as previously described. An ohmic contact is provided by alloying the gold to a HgTe layer 306 which is positioned between the infrared sensitive material 302 and the patch 304. A passivation layer 308 of CdTe is provided above the sensitive material 302 and surrounding the layer 306. The layer 308 has a selected thickness of, for example, 1000 angstroms.

A lower ohmic contact comprises a HgTe layer 310 which is alloyed to a gold groundplane 312. In other respects, the detector 300 is substantially the same as the previous detector elements described, such as shown in FIG. 2. The current flow in detector 300 is indicated by the arrow 314 which shows vertical current flow between layers 306 and 310. The gold patch 304 must be provided with a common electrical connection with other similar patches of an array. This can be provided by a network of narrow gold strips that interconnect all gold patches.

A less desirable aspect of the infrared detector 300 shown in FIG. 13 is that it has a relatively low resistance, which makes it more difficult to interface with a conventional ROIC.

Figure 14:
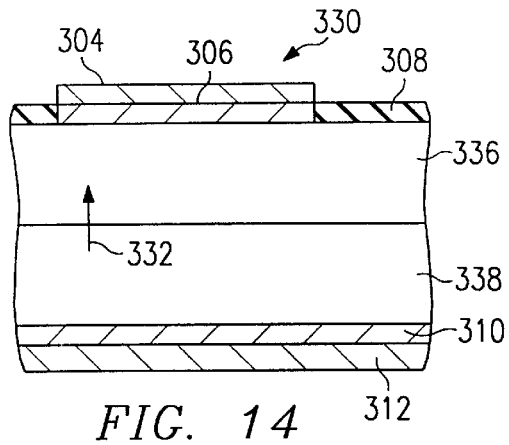
FIG. 14 is a section view of a photodiode configuration in accordance with the present invention.

A still further infrared detector 330 in accordance with the present invention is illustrated in FIG. 14. This is a structure similar to that shown in FIG. 13, with common elements having similar reference numerals, but with a photodiode infrared sensitive element in place of the HgCdTe material 302. The bias current flow is in the direction of the arrow 332. The detector element for the infrared detector 330 consists of, for example, a p-type layer 336 in contact with an n-type layer 338. An infrared photodetector photodiode configuration such as layers 336 and 338 is well known in the art. The detector 330 has a higher impedance than detector 300 and is more compatible with a conventional ROIC.

Figure 15:
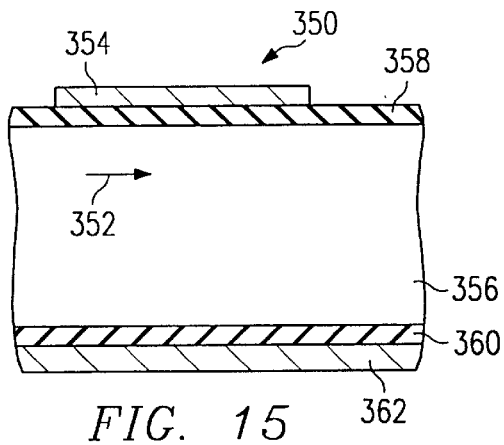
FIG. 15 is a photoconductive device in accordance with the present invention wherein the current flow is lateral.

A still further embodiment of the present invention, with variations thereof, is shown in FIGS. 15–20. An infrared radiation detector 350 is shown in FIG. 15. This detector has a lateral current flow as indicated by the arrow 352. This is in contrast to the previously described infrared detector structures which have had a vertical current flow, such as shown in FIG. 13. The detector 350 includes a gold patch 354, such as previously described. Infrared sensitive material 356 which is, for example, HgCdTe, as previously described, is positioned between nonconductive CdTe layers 358 and 360. The gold patch 354 is positioned on top of the layer 358. A gold groundplane 362, such as previously described, is positioned on the lower surface of the insulating layer 360.

Figure 16:
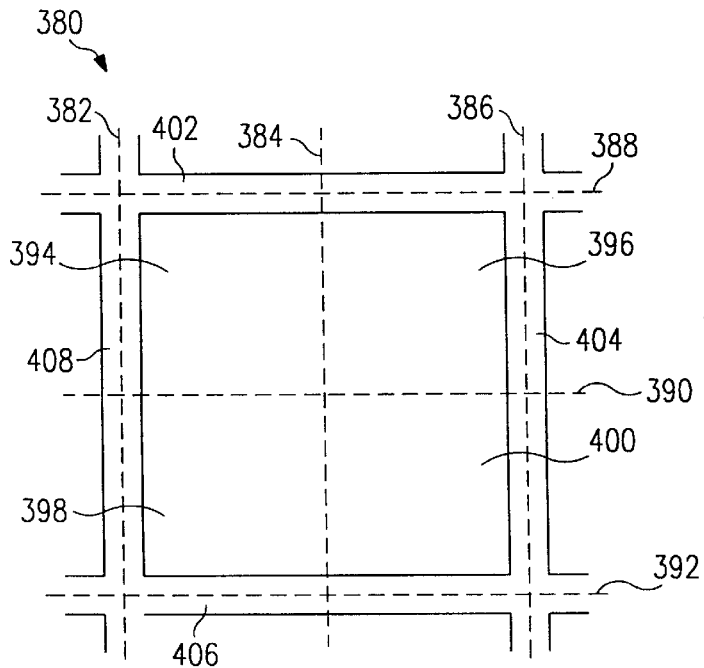
FIG. 16 is a plan view of a further embodiment of the present invention illustrating four pixels encompassed by a common planar bus.

A pixel structure for implementing the detector configuration shown in FIG. 15 is illustrated in FIG. 16. This is a top view of four pixels. Each pixel contains a plurality, such as 16, of the detectors, such as 350 shown in FIG. 15. The pixel structure 380 shown in FIG. 16 has isolation trenches, not shown, which are positioned as indicated by the dashed lines 382, 384, 386, 388, 390 and 392. These pixel-isolating trenches define pixels 394, 396, 398 and 400. The structure 380 is further provided with intersecting conductive gold strips 402, 404, 406 and 408 which serve as a common bus to the edge of the array which includes the pixel structure 380.

The size configurations for the detectors shown in FIGS. 13, 14 and 15 are similar to those shown in earlier detector descriptions, such as in FIG. 1.

A first version of the infrared detector configuration as shown in FIGS. 15 and 16 is illustrated as a pixel structure 410 in FIG. 17. The pixel structure 410 includes the gold strips 406 and 408 as shown in FIG. 16. It further includes a plurality of infrared detector elements, such as 412 and 414 which are the same as infrared detector element 350 shown in FIG. 15. Each detector in structure 410 has lateral current flow.

A section view of the pixel structure 410 is illustrated in FIG. 18. This includes the common elements with similar reference numerals to that shown in FIG. 15. Further included is an epoxy 418 which binds the structure 410 to an ROIC 420. An indium bump 422 provides an electrical connection between the groundplane 362 and the ROIC 420. As shown in FIG. 18, the lateral current flow is between the gold strip 408 and the exposed portion 362A of the conductive groundplane 362. The configuration having the lateral current flow has a substantially higher resistance (several orders of magnitude) as compared to the configuration with the vertical current flow and is therefore better impedance matched with a conventional ROIC.

A further variation of the lateral flow embodiment of the present invention is a pixel structure 450 shown in FIGS. 19 and 20. In FIG. 19, sixteen gold patches are shown, such as 452 and 454. This is a structure in which the infrared sensitive material is etched to produce a structure somewhat similar to that shown in FIG. 6, but with a serpentine interconnection pattern which electrically interconnects all sixteen of the resonant cavity structures in series between the gold strip 404 and the exposed portion 362A of the groundplane 362. This interconnection of sixteen such infrared detector elements provides a relatively high resistivity which is a desirable characteristic for an infrared detector array and has an impedance compatible with a conventional ROIC.

As noted above, all of the infrared detectors illustrated in FIGS. 13–20 have the same sizes and relative configurations as that described for the detectors in FIGS. 1 and 2 for enhanced absorption of incident infrared radiation using patches.

Figure 21:
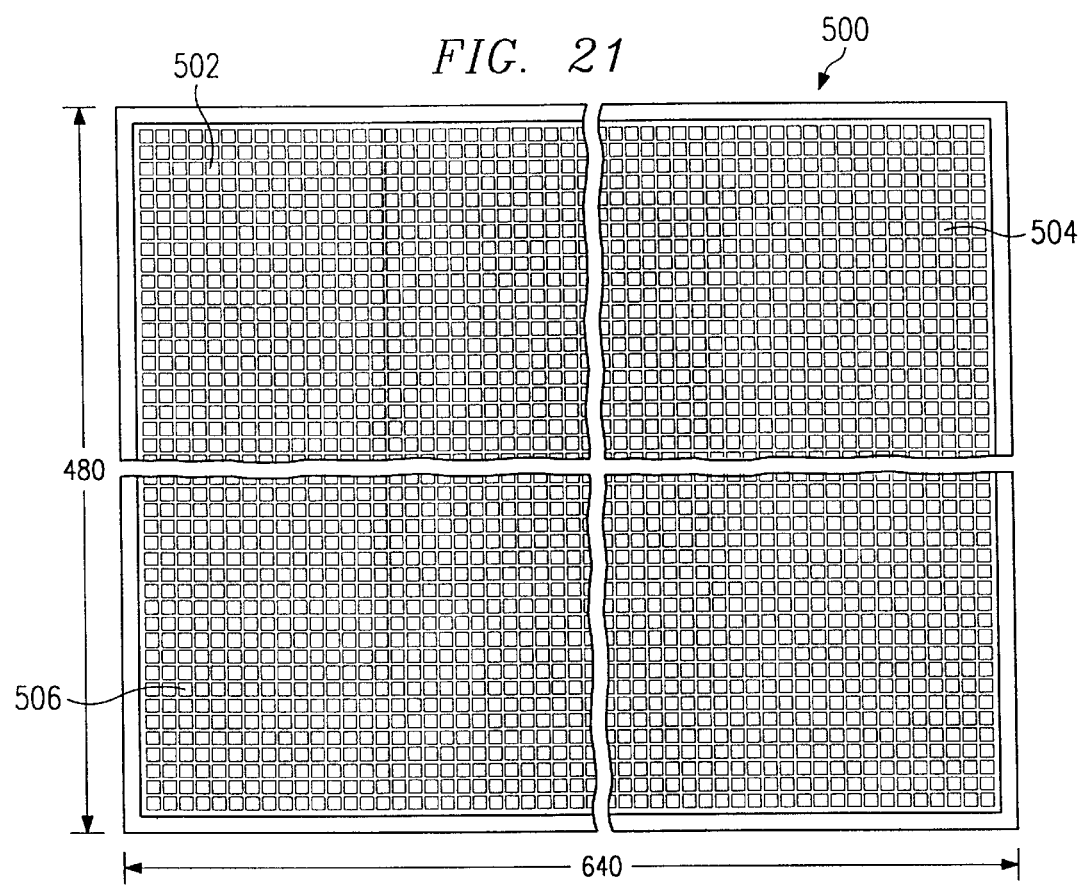
FIG. 21 is a plan view of an imager in accordance with the present invention having a plurality of pixel elements which may be any one of the pixel elements described above.

FIG. 21 is an illustration of an imager utilizing the detector structure of the present invention. An imager 500, in a selected embodiment, has a 640×480 array of pixel elements to produce an image for display on a screen. Representative pixel elements are 502, 504 and 506. Each of these pixel elements may be any one of the above described pixel structures. Each pixel has a corresponding indium bump for connection to an ROIC. A dual band configuration has two bumps for each pixel element, such as shown in FIG. 9. The signals produced by all the pixel elements are conveyed to an ROIC which produces an image signal for transmission to a computer or display device.

Figure 22A:
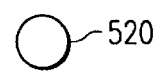
FIG. 22A is an illustration of a round patch.
Figure 22B:
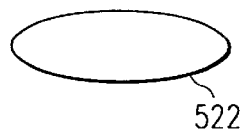
FIG. 22B is an illustration of an oval patch.
Figure 22C:
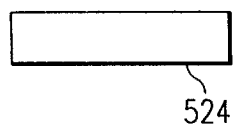
FIG. 22C is an illustration of a rectangular patch, all in accordance with the present invention.

The patches shown in FIG. 1 are square. However, these patches can have a round configuration as shown in FIG. 22A, an oval configuration as shown in FIG. 22B or a rectangular configuration as shown in FIG. 22C. The round and square configurations have no polarization sensitivity, but the oval and rectangular configurations do have a sensitivity to polarization for the incident infrared radiation.

Although several embodiments of the invention have been illustrated in the accompanying drawings and described in the foregoing Detailed Description, it will be understood that the invention is not limited to the embodiments disclosed, but is capable of numerous rearrangements, modifications and substitutions without departing from the scope of the invention.

What I claim is:

1. An infrared radiation detector comprising:

a planar, infrared radiation sensitive structure for producing carriers in response to infrared radiation, said infrared radiation sensitive structure having first and second surfaces, a first electrically conductive layer proximate said infrared sensitive structure first surface and electrically connected thereto, said first electrically conductive layer transparent to said infrared radiation, a planar patch conductive for said infrared radiation positioned on the surface of said first conductive layer opposite said infrared sensitive structure, said patch having a width equal to approximately one half of a wavelength of said infrared radiation in said infrared sensitive structure, an electrically conductive, planar infrared radiation reflective layer positioned proximate said second surface of said infrared sensitive structure and electrically connected thereto, and wherein a resonant cavity is formed between said conductive patch and said reflective layer, said resonant cavity having a thickness not greater than approximately one eighth of the wavelength of said infrared radiation in said infrared sensitive structure.

2. An infrared radiation detector as recited in claim 1 wherein said planar, infrared radiation sensitive structure is a multiple quantum well structure.

3. An infrared radiation detector as recited in claim 1 wherein said planar, infrared radiation sensitive structure comprises mercury cadmium telluride.

4. An infrared radiation detector as recited in claim 1 including a second electrically conductive layer positioned between and electrically connected with said infrared radiation sensitive structure and said reflective layer, said second electrically conductive layer transparent to said infrared radiation.

5. An infrared radiation detector as recited in claim 1 wherein said patch is round.

6. An infrared radiation detector as recited in claim 1 wherein said patch is square.

7. An infrared radiation detector as recited in claim 1 wherein said patch is elongate.

8. An infrared radiation detector as recited in claim 1 wherein said first electrically conductive layer and said infrared radiation sensitive structure are patterned to have a least a portion thereof shaped to have a similar configuration to said patch.

9. An infrared radiation detector as recited in claim 1 wherein said infrared sensitive structure is tuned for a maximum photoconductive response for infrared radiation having a wavelength in said infrared sensitive structure which is approximately eight times that of the thickness of said infrared sensitive structure.

10. An infrared radiation detector comprising:
    a planar multiple quantum well structure for producing carriers in response to infrared radiation, said quantum well structure having first and second surfaces,
    a first electrically conductive layer located on said quantum well structure first surface, said first electrically conductive layer transparent to said infrared radiation,
    a second electrically conductive layer located on said quantum well structure second surface, said second electrically conductive layer transparent to said infrared radiation,
    a planar patch conductive for said infrared radiation positioned on the surface of said first conductive layer opposite said multiple quantum well structure, said patch having a width equal to approximately one half of a wavelength of said infrared radiation in said quantum well structure,
    an electrically conductive, planar infrared radiation reflective layer positioned on the surface of said second conductive layer opposite said multiple quantum well structure, and
    wherein a resonant cavity is formed between said conductive patch and said reflective layer, said resonant cavity having a thickness not greater than approximately one eighth of the wavelength of said infrared radiation in said quantum well structure.

11. An infrared radiation detector as recited in claim 10 wherein said patch is round.

12. An infrared radiation detector as recited in claim 10 wherein said patch is square.

13. An infrared radiation detector as recited in claim 10 wherein said patch is elongate.

14. An infrared radiation detector as recited in claim 10 wherein said first electrically conductive layer and said multiple quantum well structure are patterned wherein at least a portion thereof has a shape substantially corresponding to said planar patch.

15. An infrared radiation detector as recited in claim 10 wherein said multiple quantum well structure is tuned for a maximum photoconductive response for infrared radiation having a wavelength in said multiple quantum well structure which is approximately eight times that of the thickness of said multiple quantum well structure.

16. An infrared detector pixel element, comprising:
    a planar multiple quantum well structure for producing carriers in response to infrared radiation, said quantum well structure having first and second surfaces,
    a first electrically conductive layer located on said quantum well structure first surface, said first electrically conductive layer transparent to said infrared radiation,
    a second electrically conductive layer located on said quantum well structure second surface, said second electrically conductive layer transparent to said infrared radiation,
    an array of planar patches conductive for said infrared radiation positioned on the surface of said first conductive layer opposite said multiple quantum well structure, each said patch having a width equal to approximately one half of a wavelength of said infrared radiation in said quantum well structure,
    an electrically conductive, planar infrared radiation reflective layer positioned on the surface of said second conductive layer opposite said multiple quantum well structure, and
    wherein a resonant cavity is formed between each of said conductive patches and said reflective layer, each said resonant cavity having a thickness not greater than approximately one eighth of the wavelength of said infrared radiation in said quantum well structure.

17. An infrared detector pixel element as recited in claim 16 wherein said planar multiple quantum well structure and said first electrically conductive layer are patterned to have regions thereof between said planar patches and said second conductive layer.

18. An infrared detector pixel element as recited in claim 16 wherein each of said patches is round.

19. An infrared detector pixel element as recited in claim 16 wherein each of said patches is square.

20. An infrared detector pixel element as recited in claim 16 wherein each of said patches is elongate.

21. An infrared detector pixel element as recited in claim 16 wherein said multiple quantum well structure is tuned for a maximum photoconductive response for infrared radiation having a wavelength in said muliple quantum well structure which is approximately eight times that of the thickness of said multiple quantum well structure.

22. An infrared radiation detection imager comprising:
    a planar array of pixel elements each comprising:
        a planar infrared radiation sensitive structure for producing carriers in response to infrared radiation, said infrared sensitive structure having first and second surfaces,
        a first electrically conductive layer proximate said infrared sensitive structure first surface and electrically connected thereto, said first electrically conductive layer transparent to said infrared radiation,
        an array of planar patches conductive for said infrared radiation positioned on the surface of said first conductive layer opposite said infrared sensitive structure, each said patch having a width equal to approximately one half of a wavelength of said infrared radiation in said infrared sensitive structure,
        an electrically conductive, planar infrared radiation reflective layer positioned proximate said second surface of said infrared sensitive structure and electrically connected thereto,
    wherein a resonant cavity is formed between each of said conductive patches and said reflective layer, each said resonant cavity having a thickness not greater than approximately one eighth of the wavelength of said infrared radiation in said infrared sensitive structure, and
    a respective electrical conductor connected to each of said planar infrared radiation reflective layers for conveying a pixel element signal from the corresponding pixel element, wherein said pixel element signals comprise an image of said infrared radiation which is received by said imager.

23. An infrared radiation detection imager as recited in claim 22 wherein said planar, infrared radiation sensitive structure is a multiple quantum well structure.

24. An infrared radiation detection imager as recited in claim 22 wherein said planar, infrared radiation sensitive structure comprises mercury cadmium telluride.

25. An infrared radiation detection imager as recited in claim 22 including a second electrically conductive layer positioned between and electrically connected with said infrared radiation sensitive structure and said reflective layer, said second electrically conductive layer transparent to said infrared radiation.

26. An infrared radiation detection imager as recited in claim 22 wherein each of said patches is round.

27. An infrared radiation detection imager as recited in claim 22 wherein each of said patches is square.

28. An infrared radiation detection imager as recited in claim 22 wherein each of said patches is elongate.

29. An infrared radiation detection imager as recited in claim 22 wherein said first electrically conductive layer and said infrared radiation sensitive structure are patterned to have a least a portion thereof shaped to have a similar configuration to the corresponding one of said patches.

30. An infrared radiation detection imager as recited in claim 22 wherein said infrared sensitive structure is tuned for a maximum photoconductive response for infrared radiation having a wavelength in said infrared sensitive structure which is approximate eight time that of the thickness of said infrared sensitive structure.

31. A dual band infrared radiation detector pixel element, comprising:

a first set of spaced apart multiple quantum well structures for producing carriers in response to infrared radiation, each said quantum well structure having a first and a second surface, a first patterned electrically conductive layer positioned on said first surfaces of said quantum well structures, said first electrically conductive layer transparent to said infrared radiation, a first array of planar patches conductive for said infrared radiation and positioned respectively on the surface of said first electrically conductive layer opposite and above each of said multiple quantum well structures, each said patch in said first array having a width equal to approximately one half of a wavelength for a first band of said infrared radiation in said first set of quantum well structures, a second electrically conductive layer in electrical contact with said second surfaces of said multiple quantum well structures in said first set, said second electrically conductive layer transparent to said infrared radiation, a planar multiple quantum well structure, for producing carriers in response to said infrared radiation, positioned on the opposite side of said second electrically conductive layer from said first set of multiple quantum well structures, a second array of planar patches conductive for said infrared radiation and positioned on the side of said second electrically conductive layer opposite said planar multiple quantum well structure, each said patch in said second array having a width equal to approximately one half of a wavelength for a second band of said infrared radiation in said planar multiple quantum well structure, a third electrically conductive layer positioned on the opposite surface of said planar multiple quantum well structure from said second electrically conductive layer and in electrical contact with said planar multiple quantum well structure, an infrared radiation reflective layer positioned on the side of said third electrically conductive layer opposite said planar multiple quantum well structure, an infrared radiation reflective layer positioned on the side of said third electrically conductive layer opposite said plunar multiple quantum well structure, and wherein a first set of resonant cavities are formed between each of said patches in said first array and said reflective layer, each said resonant cavity in said first set having a thickness not greater than approximately one eighth of the wavelength of said first band of said infrared radiation in said first quantum well structures, and wherein a second set of resonant cavities are formed between each of said patches in said second array and said reflective layer, each said resonant cavity in said second set having a thickness not greater than approximately one eighth of the wavelength of said second band of said infrared radiation in said planar multiple quantum well structure.

32. An infrared radiation detector pixel element as recited in claim 31 wherein said patches in the first and second arrays are round.

33. An infrared radiation detector pixel element as recited in claim 31 wherein said patches in the first and second arrays are square.

34. An infrared radiation detector pixel element as recited in claim 31 wherein said patches in the first and second arrays are elongate.

35. An infrared radiation detector pixel element as recited in claim 31 wherein said first electrically conductive layer and each of said multiple quantum well structures are patterned such that at least a portion thereof has a shape substantially corresponding to the respectively positioned first array of planar patches.

36. An infrared radiation detector as recited in claim 31 wherein each of said first multiple quantum well structures is tuned for a maximum photoconductive response for infrared radiation having a wavelength in said first multiple quantum well structure which is approximately eight times that of the thickness of said first multiple quantum well structure.

37. An infrared radiation detector comprising:

a planar, infrared radiation sensitive structure for producing carriers in response to infrared radiation, said infrared radiation sensitive structure having first and second surfaces, a first electrically nonconductive layer proximate said infrared sensitive structure first surface, said first electrically nonconductive layer transparent to said infrared radiation, a planar patch positioned on the surface of said first nonconductive layer opposite said infrared sensitive structure, said patch having a width equal to approximately one half of a wavelength of said infrared radiation in said infrared sensitive structure, a second electrically nonconductive layer proximate said second surface of said infrared sensitive structure, a planar infrared radiation reflective layer positioned proximate said second electrically nonconductive layer opposite said infrared sensitive structure, a first conductor in electrical contact with said infrared radiation sensitive structure at said first surface at a position offset from said planar patch, a second conductor in electrical contact with said infrared radiation sensitive structure at said second surface at a position on said second surface offset from the corresponding location of said first conductor at said first surface, wherein current flow in said infrared radiation sensitive structure is between said first and second conductors and is substantially parallel to the plane of said infrared radiation sensitive structure, and wherein a resonant cavity is formed between said conductive patch and said reflective layer, said resonant cavity having a thickness not greater than approximately one eighth of the wavelength of said infrared radiation in said infrared sensitive structure.

38. An infrared radiation detector as recited in claim 37 wherein said planar, infrared radiation sensitive structure comprises mercury cadmium telluride.

39. An infrared radiation detector structure comprising:

a planar, infrared radiation sensitive structure for producing carriers in response to infrared radiation, said infrared radiation sensitive structure having first and second surfaces, a first electrically nonconductive layer proximate said infrared sensitive structure first surface, said first electrically nonconductive layer transparent to said infrared radiation, an array of planar patches positioned on the surface of said first nonconductive layer opposite said infrared sensitive structure, each said patch having a width equal to approximately one half of a wavelength of said infrared radiation in said infrared sensitive structure, a second electrically nonconductive layer proximate said second surface of said infrared sensitive structure, a planar infrared radiation reflective layer positioned proximate said second electrically nonconductive layer opposite said infrared sensitive structure, a first conductor in electrical contact with said infrared radiation sensitive structure at said first surface at a position offset from said array of planar patches, a second conductor in electrical contact with said infrared radiation sensitive structure at said second surface at a position on said second surface offset from the corresponding location of said first conductor at said first surface, wherein current flow in said infrared radiation sensitive structure is between said first and second conductors and is substantially parallel to the plane of said infrared radiation sensitive structure, and wherein a resonant cavity is formed between each of said conductive patches and said reflective layer, each said resonant cavity having a thickness not greater than approximately one eighth of the wavelength of said infrared radiation in said infrared sensitive structure.

40. An infrared radiation detector as recited in claim 39 wherein said planar, infrared radiation sensitive structure comprises mercury cadmium telluride.

* * * * *

UNITED STATES PATENT AND TRADEMARK OFFICE
CERTIFICATE OF CORRECTION

PATENT NO. : 5,773,831
DATED : June 30, 1998
INVENTOR(S) : Austin John Brouns

It is certified that error appears in the above-identified patent and that said Letters Patent is hereby corrected as shown below:

Column 16, lines 1-3, claim 31, delete "an infrared radiation reflective layer positioned on the side of said third electrically conductive layer opposite said plunar multiple quantum well structure,".

Signed and Sealed this

Eighteenth Day of May, 1999

*Attest:*

Q. TODD DICKINSON

*Attesting Officer*     Acting Commissioner of Patents and Trademarks